(12) United States Patent
Phan Le et al.

(10) Patent No.: US 8,717,111 B2
(45) Date of Patent: *May 6, 2014

(54) OSCILLATOR DEVICE

(75) Inventors: Kim Phan Le, Eindhoven (NL); Jozef Thomas Martinus Van Beek, Rosmalen (NL); Peter Gerard Steeneken, Valkenswaard (NL)

(73) Assignee: NXP, B.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/122,754

(22) PCT Filed: Oct. 8, 2009

(86) PCT No.: PCT/IB2009/054409
§ 371 (c)(1),
(2), (4) Date: Apr. 6, 2011

(87) PCT Pub. No.: WO2010/041209
PCT Pub. Date: Apr. 15, 2010

(65) Prior Publication Data
US 2011/0193449 A1    Aug. 11, 2011

(30) Foreign Application Priority Data
Oct. 8, 2008  (EP) .................................... 08105521

(51) Int. Cl.
H03B 5/32    (2006.01)
H01L 41/08   (2006.01)

(52) U.S. Cl.
USPC ............................ 331/154; 310/312; 333/219

(58) Field of Classification Search
USPC ......... 331/116 M, 116 R, 154; 310/311, 312; 333/186, 200, 219
See application file for complete search history.

(56) References Cited

U.S. PATENT DOCUMENTS

| 5,955,668 | A | 9/1999 | Hsu et al. | |
| 5,994,971 | A | 11/1999 | Edwards | |
| 6,686,807 | B1* | 2/2004 | Giousouf et al. | 331/154 |
| 7,102,467 | B2 | 9/2006 | Lutz et al. | |
| 7,221,241 | B2* | 5/2007 | Lutz et al. | 333/186 |
| 7,750,745 | B2* | 7/2010 | Van Beek | 331/116 M |
| 7,898,148 | B2* | 3/2011 | Steeneken et al. | 310/317 |
| 2007/0063613 | A1 | 3/2007 | Elata et al. | |
| 2008/0143451 | A1* | 6/2008 | Sprague et al. | 331/157 |
| 2010/0277262 | A1* | 11/2010 | Phan Le et al. | 333/219 |
| 2011/0025426 | A1* | 2/2011 | Steeneken et al. | 331/155 |

FOREIGN PATENT DOCUMENTS

| CN | 1977448 A | 6/2007 |
| WO | 01/33711 A1 | 5/2001 |
| WO | 2008/018347 A2 | 2/2008 |

OTHER PUBLICATIONS

Greywall, D. "Sensitive Magnetometer Incorporating a High-Q Nonlinear Mechanical Resonator," Meas. Sci. Technol. 16, pp. 2473-2482 (2005).

Reichenbach, R. B., et al. "RF MEMS Oscillator with Integrated Resistive Transduction", IEEE Electron Device Letters, vol. 27, No. 10, pp. 805-807 (2006).

(Continued)

Primary Examiner — Levi Gannon

(57) ABSTRACT

An oscillator device comprises a resonator mass which is connected by a spring arrangement to a substrate and a feedback element for controlling oscillation of the resonator mass, which comprises a piezoresistive element connected between the resonator mass and the substrate. The invention provides an oscillator device in which the two parts (resonator and circuit to close the oscillation loop) are combined inside one single oscillator device, which can be a MEMS device.

15 Claims, 9 Drawing Sheets

(56) References Cited

OTHER PUBLICATIONS

International Search Report and Written Opinion for Int'l. Patent Appln. No. PCT/IB2009/054409—(Jan. 12, 2010).

Reference CN1977448A cited in communication from foreign patent office in counterpart foreign application No. CN200980139876.1.

\* cited by examiner

OSCILLATOR DEVICE

This invention relates to oscillator devices, for example which can be implemented using MEMS technology.

MEMS oscillators are being intensively studied in many research groups and some first products have recently been released. This type of device offers high Q-factor, small size, high level of integration and potentially low cost. These devices are expected to replace bulky quartz crystals in high-precision oscillators.

Such oscillators are widely used in time-keeping and frequency reference applications such as RF modules in mobile phones, devices containing blue-tooth modules and other digital and telecommunication devices. Since the oscillation frequency can depend on mass, temperature, acceleration or magnetic field, the oscillators can also be used as very sensitive sensors.

The conventional MEMS-based oscillator is shown schematically in FIG. 1.

Basically it consists of a MEMS resonator 10 and an external amplifier circuit 12. The MEMS resonator 10 consists of a silicon mass-spring system, which can be excited into mechanical resonant vibration, and means to sense this vibration and to convert it into an electrical signal. The electrical signal is fed into the amplifier circuit 12. This circuit basically consists of a gain amplifier 14 and a phase shifter 16. The output of the amplifier is fed back into the actuation side of the resonator. If the total loop gain is larger than one and the loop phase shift is zero, the oscillation can be maintained within the loop.

There are several ways to sense the signal and to actuate the resonator. In most MEMS resonators, excitation is done by electrostatic actuation and sensing is done by capacitive or piezoresistive method. In some cases, the actuation can be done by the piezoelectric or thermal expansion.

The conventional oscillators based on a MEMS resonator and an external circuit a number of problems. Most significantly, the device must be built up from two separate parts: the MEMS resonator device and the (transistor-based) amplifier circuit. The two parts are normally built on separate dies or ultimately can be integrated on a single Si die, but the technologies and processes for the two parts are essentially different. Unless the amplifier circuit can be put on the same area as the resonator, the combined device will be larger than the resonator alone. Consequently there are further problems, such as significant power needed for the amplifier and further circuit blocks (e.g. phase shifter, buffer, charge pumps to generate a DC bias voltage for the resonator). These additional circuits give rise to the presence of parasitic capacitance due to bonding wires, and bond pads cause extra undesired phase shifts and/or loop losses.

Most MEMS resonators use electrostatic actuation. The efficiency of the actuation can be indicated by the electromechanical coupling efficiency $\eta$:

$$\eta = \frac{\varepsilon_0 A V_{dc}}{g^2}$$

in which A is the electrode area, $V_{dc}$ is the DC bias voltage that needs to be applied on the electrodes to create actuation force (besides an AC voltage) and g is the width of the transduction gap between the electrodes.

From this formula it is clear that the electrode area must be maximized and the gap size must be minimized to assure a good coupling efficiency. Because A is determined by the thickness of the MEMS structure and the length of the electrode, the above requirement means that a transduction gap with a very high aspect ratio is required. The technique used to realize such high aspect ratio gaps (or trenches) is one of the most difficult steps in the entire process.

Another disadvantage of using electrostatic actuation is that it results in an intrinsically non-linear signal, since the electrostatic force depends not just on voltage but also on the displacement. The bias voltage must also be relatively high, in the order of 5V up to a few tens of V, which requires charge pump stages on chip.

According to the invention, there is provided an oscillator device, comprising:

a resonator mass which is connected by a spring arrangement to a substrate; and a feedback element for controlling oscillation of the resonator mass, which comprises a piezoresistive element connected to the resonator mass and which is arranged such that the strain in the piezoresistive element varies in response to movement of the resonator mass, and a change in strain in the piezoresistive element causes a change in electrical resistance; and means for driving a current through the feedback element (62), wherein actuation means for controlling the oscillation comprise terminals for driving the current through the feedback element (62).

The invention provides an oscillator device in which the two parts (resonator and circuit to close the oscillation loop) are combined inside one single resonator device, which can be a MEMS device. The device consists of a mass-spring system like the conventional resonator and, besides, one or more feedback elements which can also be made within the MEMS structure. These feedback elements sense the strain from the vibration using the piezoresistive effect and convert the piezoresistive signal into mechanical stress within themselves, using the thermal expansion effect (resulting from the change in electrical energy dissipation), to positively feed back into the mechanical vibration. In this way, the oscillation loop can be closed within the same resonator structure, without having to use any external circuit. Furthermore, the use of the thermal expansion effect for actuation eliminates the need to make difficult transduction gaps between actuation electrodes and the resonator mass. The feedback element can be connected between the resonator mass and the substrate, or between multiple resonator masses, as long as the mode of vibration of the resonator mass results in changes in strain, which in turn can be used to provide feedback control.

The device operates by converting mechanical motion of the resonator mass to changes in strain in the piezoresistive element. This causes a change in resistance of the piezoresistive element. As a current flows through the piezoresistive element, this change in resistance causes a change in the electrical energy that is dissipated ($P=I^2R$), which causes a change in temperature. The change in temperature causes a thermal expansion force, which provides a mechanical feedback function to provide feedback control of the vibration of the resonator mass. Thus, the feedback element is adapted to convert resonator mass movement into heating, and to convert the heating into thermal expansion thereby providing a mechanical feedback function.

A current source can be provided for supplying current to the piezoresistive element (constant current operation, in which the current is kept substantially constant), or a voltage source can be used to supply a voltage (constant voltage operation in which the voltage is kept substantially constant).

Other than the terminals for driving current through the piezoresistive element, no other actuation electrodes are required for controlling the oscillation.

The resonator mass can be connected to the substrate by at least two arms which together form the spring arrangement, wherein a first arm comprises the piezoresistive element and a second arm comprises a current return path for the piezoresistive element. In this way, the spring arrangement and feedback elements are implemented by the same structure. Two resonator masses can be coupled together by the at least two arms, with a mid point of each arm being coupled to the substrate.

In one implementation, the first, piezoresistive element, arm is doped with a first doping level, and the second arm is doped with a second, higher doping level. The two arms are essentially the same material, for example silicon, but the different doping levels provide the implementation of a single feedback element. In another arrangement, the first, piezoresistive element, arm is smaller in cross section than the second arm. This again defines different piezoresistive properties.

The oscillator device can comprise two resonator masses coupled together by the first arm, wherein each resonator mass has a respective second arm, one of which comprises a current input arm and the other of which comprises a current output arm. This can be used to define a pair of masses that oscillate by swinging in antiphase.

In an alternative arrangement, the resonator mass can have rotational symmetry, with at least first and second arms connecting the resonator mass to the substrate, at different angular positions around the resonator mass.

The feedback element can comprise at least two arms. An additional output arm may also be provided for giving an output voltage.

The feedback element can comprise a single arm arranged to bend, wherein opposite edges of the arm define a pair of piezoresistive elements.

Thus, it will be seen that many different implementations are possible with the oscillation based on bending of the arms connecting the resonator mass to the substrate, rotating of the resonator mass, or compression/expansion of arms connecting the resonator mass to the substrate.

In all cases, the resonator mass and the feedback element can comprise a single body. Similarly, the resonator mass and the spring arrangement can comprise a single body. This body can be a silicon body, enabling standard MEMS manufacturing technology to be used.

The invention also provides a method generating an oscillating signal, comprising:

driving a current through a piezoresistive element using terminals which function as the actuation means for controlling the oscillation;

controlling oscillation of a resonator mass using the piezoresistive element, which is arranged such that the strain in the piezoresistive element varies in response to movement of the resonator mass, and a change in strain in the piezoresistive element causes a change in electrical resistance; and sensing the movement of the resonator mass to derive the oscillating signal.

The invention will now be described in detail with reference to the accompanying drawings, in which.

The invention provides an oscillator device in which oscillation of a resonator mass is controlled by a piezoresistive element.

In the device of the invention, three physics phenomena are coupled: thermal, electrical (e.g. piezoresistive) and mechanical.

Figure 1:
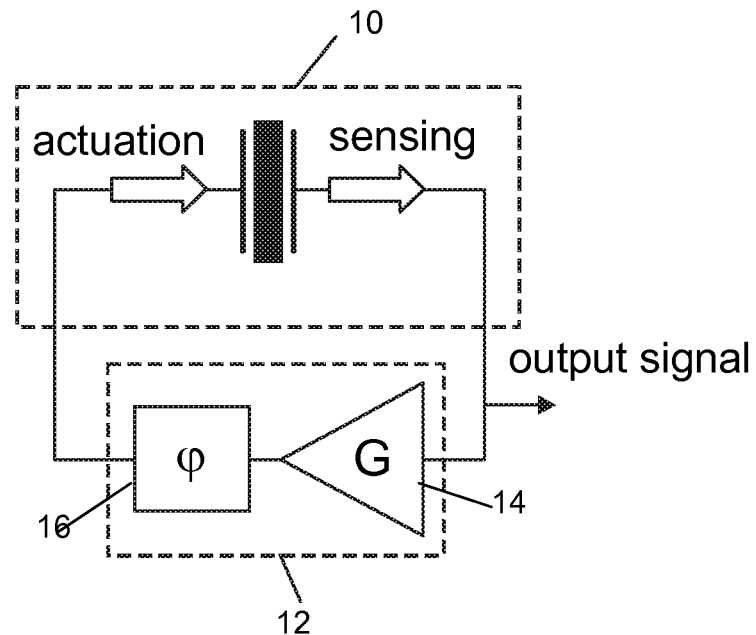
FIG. 1 shows in schematic form a known MEMS oscillator arrangement.
Figure 2:
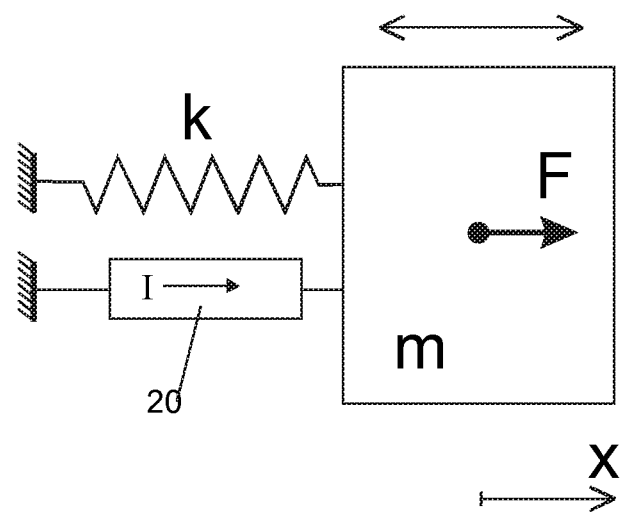
FIG. 2 is used to explain the general principles underlying the device of the invention.

FIG. 2 is a simplified schematic diagram of the device of the invention. The device consists of a mass-spring system (m denotes the effective mass and k denotes the effective spring stiffness) and one or more feedback elements 20. These will be termed sensing-actuation (S-A) elements in the following description, as they provide the control of the oscillation, but can also provide the electrical oscillating signal output from the device.

The sensing-actuation elements 20 connect the mass to the fixed frame of the device, namely the substrate. In reality the sensing-actuation elements and the mass can be the spring itself or a part of the spring. In FIG. 2 and in the detailed explanation below, only one S-A element 20 is shown and discussed for the sake of simplicity.

The S-A element 20 is made of a piezoresistive material, for instance p- or n-doped Silicon. The S-A element in this case is preferably made of the same material and with the same process as the mass-spring system, but this is not essential.

During operation, a DC current, I, is sent through the S-A element 20. The return path for the current is not shown in FIG. 2, but examples are given below. The device is designed in such a way that during vibration of the mass, the S-A element is substantially compressed and stretched. The operation principle of the device can be explained as follows.

The mass-spring system can resonate at its natural angular frequency:

$$\omega_0 = \sqrt{\frac{k}{m}} \quad (1)$$

and with the quality factor Q, the inverse of which (1/Q) determines the fractional energy loss per cycle due to damping. To sustain the oscillation, this loss must be compensated by the oscillation loop. In the device of the invention, the compensation is fulfilled by means of the S-A element.

Assuming a constant voltage V is applied to the S-A element that causes a current I flowing through the element, and the element has the piezoresistive property with a positive gauge factor K. During the first quarter of a vibration cycle, the mass is assumed to move towards the fixed frame (substrate), that compresses the S-A element. This means that the element experiences negative strain $\epsilon$:

$$\epsilon = x/l \tag{2}$$

in which l is the length of the S-A element and x is the displacement of the moving end of the S-A element (x<0), thus also the displacement of the mass (the mass is considered a solid structure).

Due to the piezoresistive effect, the resistance of the element decreases, according to:

$$R = R_{dc}(1+K\epsilon) \tag{3}$$

in which $R_{dc}$ is the resistance of the element at zero strain. Because the Joule heating power is $$P_{Joule} = V^2/R = \frac{V^2}{R_{dc}(1+K\varepsilon)} \approx \frac{V^2}{R_{dc}}(1-K\varepsilon) = P_{dc}(1-K\varepsilon) \tag{4}$$

In the above formula, the approximation can be taken since $K\epsilon \ll 1$.

With the constant voltage V and positive K, $P_{Joule}$ increases as the element is compressed ($\epsilon$<0). Consequently the temperature of the element is increased compared to its previous temperature at zero strain. Due to the thermal delay, which is inevitable due to finite heat capacitance and heat conductance, the change in temperature slightly lags behind the change in strain. The change in temperature, T, directly causes stress σ in the element due to the thermal expansion effect:

$$\sigma = E\alpha T \tag{5}$$

in which E is Young's modulus and α is the thermal expansion coefficient of the S-A element. This stress results in a force:

$$F = \sigma A = E\alpha TA \tag{6}$$

where A is the cross section of the S-A element. This force pushes the mass back in the tensile direction of the element, that helps the mass to move back in the second and third quarters of the vibration cycle. Note that in this model it is assumed that there is no delay between temperature and force.

A similar mechanism but in the opposite direction happens for the third and fourth quarters of the cycle, which helps the mass to move back after it reaches the furthest position. In this way, the vibration of the mass-spring system can be positively fed back and the oscillation can be maintained.

In order to fulfill the oscillation condition there must be some phase lag φ between the displacement and the force, i.e. between the strain and the temperature of the element. In the ideal oscillator, this phase lag is 90°, but as will be shown later, this is not essential or practically realisable.

Figure 3:
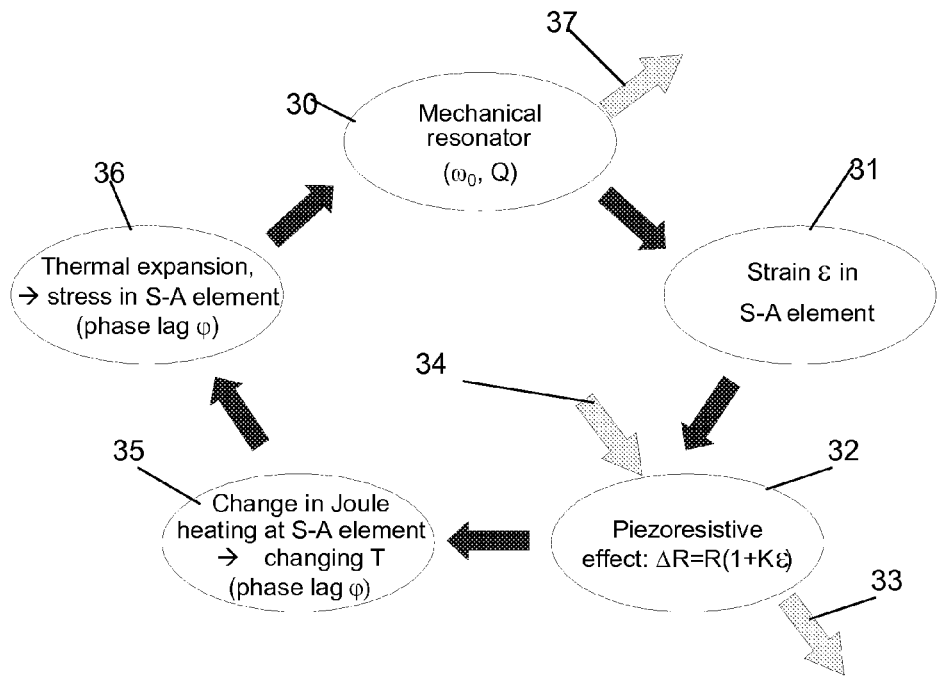
FIG. 3 is used to explain in more detail the physics underlying the operation of the device of the invention.

FIG. 3 presents an overview of the physics of the oscillation loop that takes place inside the device.

Movement of the resonator mass is shown as effect 30. This induces strain in the feedback (S-A) element, as shown by 31. The piezoresistive effect shown at 32 results in energy loss 33 dissipated as heating, in response to a power input 34 (the current supply). This causes a change in temperature with a time lag, as shown as effect 35. Thermal expansion results (effect 36) which then provides a mechanical feedback function to influence the vibration of the resonator mass at 30. There is energy loss 37 due to the resulting damping.

Thus, the device functions by sensing the strain from the mechanical vibration of the mass-spring system using the piezoresistive effect, and this is directly converted into stress using the thermal expansion effect. The stress acts as the actuation force to feed back to the mechanical vibration. The oscillation loop is thus closed within the MEMS device itself and therefore there is no need to use an external amplifier circuit.

To understand further the principle, and to find the optimum oscillation conditions, an elaborated model is presented below.

The starting point is the common equation of motion for the device:

$$m\ddot{x} + \gamma\dot{x} + kx = F \tag{7}$$

in which γ is the damping factor:

$$\gamma = \frac{\omega_0 m}{Q} \tag{8}$$

and F is the force acting on the mass, in this case the thermal expansion force. Combining (2), (6) and (8) gives:

$$m\ddot{\varepsilon} + \gamma\dot{\varepsilon} + k\varepsilon = \frac{AE\alpha}{l}T \tag{9}$$

On the other hand the Joule power P dissipated in the S-A element is related to the temperature increase by the following equation:

$$C\dot{T} + GT = P \tag{10}$$

in which C is the heat capacity and G is the heat conductance of the S-A element.

To solve the two coupled differential equations (9) and (10), it can be supposed that their solutions are in the following form:

$$T = T_{dc} + T_0 e^{j\omega t}$$

$$\varepsilon = \varepsilon_{dc} + \varepsilon_0 e^{j\omega t} \tag{11}$$

By combining (9), (10) and (11), the loop gain $G_{loop}$ can be derived:

$$G_{loop} = -\frac{\alpha AEKP_{dc}}{kl} \frac{1}{(j\omega C + G)\left(1 - \frac{\omega^2}{\omega_0^2} + j\frac{\omega}{Q\omega_0}\right)} \tag{12}$$

For sustaining the oscillation, the following two conditions must be satisfied:

$$ImG_{loop} = 0$$

$$ReG_{loop} \geq 1 \tag{13}$$

That finally leads to:

$$\omega = \omega_0 \sqrt{1 + \frac{G}{Q\omega_0 C}} \tag{14}$$

and:

$$\operatorname{Re}\frac{1}{G_{loop}} = \frac{kl}{\alpha AEKP_{dc}}\frac{G}{Q}\left(\Psi + \frac{1}{\Psi} + \frac{1}{Q}\right) \quad (15)$$

in which $$\Psi = \frac{G}{\omega_0 C}$$

is a dimensionless parameter.

Figure 4:
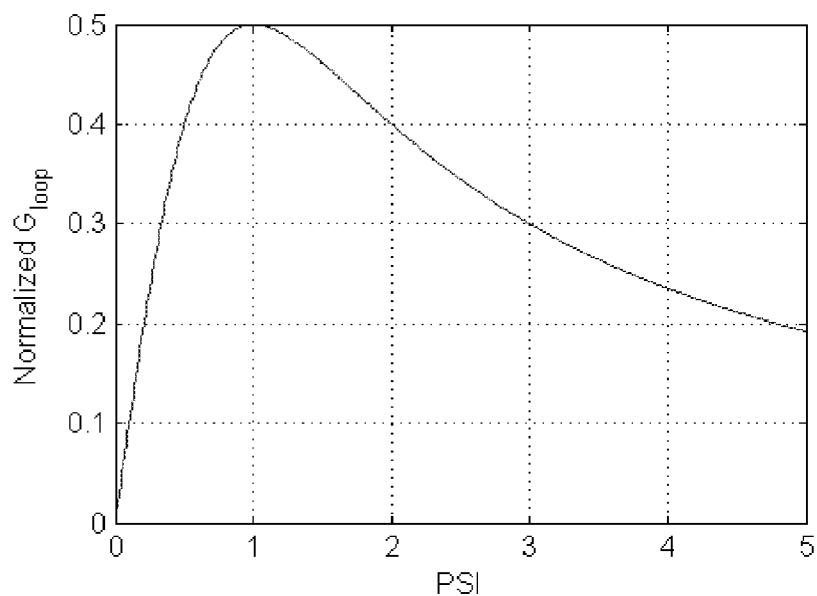
FIG. 4 is a graph to show loop gain.

FIG. 4 shows the real loop gain (normalized to $$\left(\text{normalized to } \frac{\alpha AEKP_{dc}Q}{klG}\right)$$

plotted against $\Psi$ (Psi), which shows that the loop gain is maximum when $\Psi=1$, or:

$$\frac{G}{\omega_0 C} = 1 \quad (16)$$

At this $\Psi$ value, the best oscillation condition is achieved. The maximum loop gain is:

$$\operatorname{Re}G_{loop} = \frac{\alpha AEKP_{dc}}{2kl}\frac{Q}{G} \quad (17)$$

Figure 5:
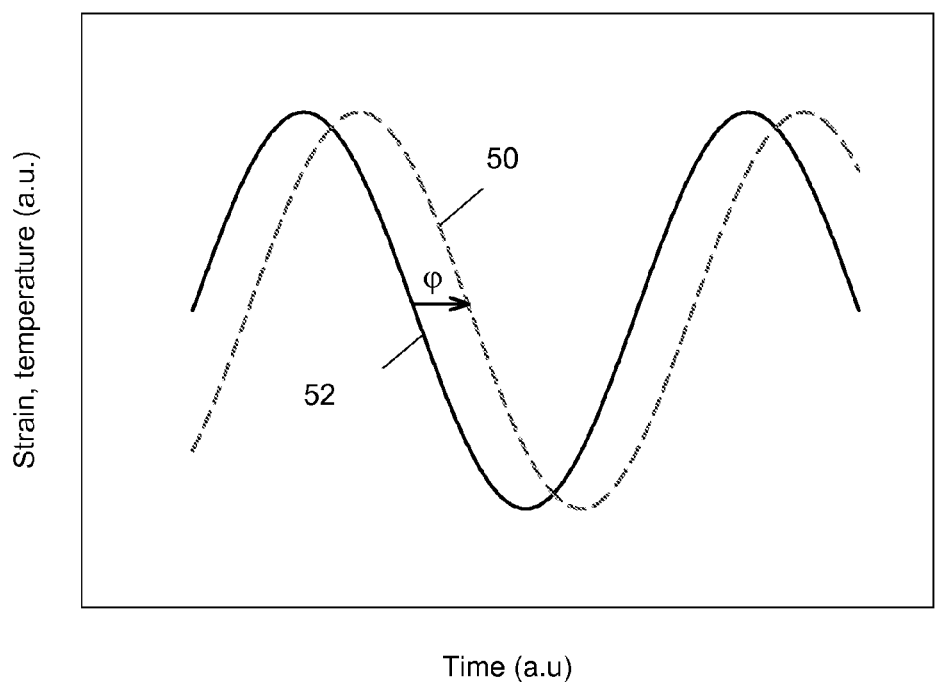
FIG. 5 is a graph to show how temperature and strain vary over time.

At this condition the phase of the temperature change is $\phi=45$ degrees lagging behind that of the strain. FIG. 5 is used to explain qualitatively the phase shift between the strain and temperature at the S-A element. Plot 50 is the temperature over time, and plot 52 is the strain. The condition $\Psi=1$ can be achieved by choosing a proper set of G and C in the relation with the intended resonant frequency. Furthermore G and C can be tuned by tuning the dimensions of the S-A element.

If the S-A element has a shape of a rectangle, the heat capacity and the heat conductance of the element can be approximated as:

$$G = 4\kappa\frac{A}{l} \quad (18)$$
$$C = c_s\rho Al$$

in which $\kappa$ is the specific heat conductivity, $\rho$ is the mass density and $c_s$ is the specific heat capacity of the material.

The condition $\Psi=1$ can now be rewritten:

$$\omega_0 l^2 = \frac{4\kappa}{c_s\rho} \quad (19)$$

The right hand side of equation (19) is determined by the material properties, and therefore can be considered substantially fixed. To satisfy (19), only the length of the S-A element must be tuned, for a given frequency.

In the above analysis, it is supposed that a constant voltage V is applied on the S-A element. To make the device oscillate (i.e. the loop gain should be positive), the gauge factor K should be positive, as suggested by equation (15). Alternatively, if a constant current I, instead of a constant voltage, is applied on the S-A element, this gives:

$$P_{Joule}=I^2R=I^2R_{dc}(1+K\epsilon)=P_{dc}(1+K\epsilon) \quad (20)$$

In order to make the loop gain positive the gauge factor K must be negative.

The sign of the piezoresistive gauge factor of Silicon can be set easily by choosing the right doping type: it is positive when Silicon is p-doped and negative when Silicon is n-doped. The magnitude of K depends on several factors, such as crystal orientation, dope concentration and temperature.

The vibration of the device can be read out using different methods. The most convenient way to sense the vibration of the structure is to use the piezoresistive effect that is already generated during the operation of the oscillator. For instance, if a constant current is used to sustain the oscillation, the voltage change on the S-A element can be used as the output signal. Alternatively, when a constant voltage is used, the current change in the S-A element is the output signal.

The vibration of the device can also be sensed using other methods such as capacitance change, temperature change, optical measurements, etc.

Due to the direct thermal-mechanical coupling in the actuation method and the absence of an external amplifier circuit, the proposed thermal-electromechanical oscillator can operate at low power. From (17), (18) and (19), the lowest power consumption for the optimum oscillation condition can be determined:

$$P_{dc} \geq \frac{4\sqrt{c_s\rho\kappa}}{\alpha K}\frac{A\sqrt{\omega_0}}{Q} \quad (21)$$

The first part of (21) depends only on the material properties and temperature; the second part is design-dependent. For example, an oscillator made of silicon having a resonant frequency of 1 MHz, a cross-sectional area of the S-A element of $1.5\times2$ $\mu m^2$, and Q of 50,000 will in principle work with a minimum DC power of 13 $\mu W$.

There are many different possible configurations for the spring arrangement, feedback element and resonator mass. A number of possible arrangements will now be outlined, although it will be understood that the examples below are not meant to be exhaustive.

Figure 6:
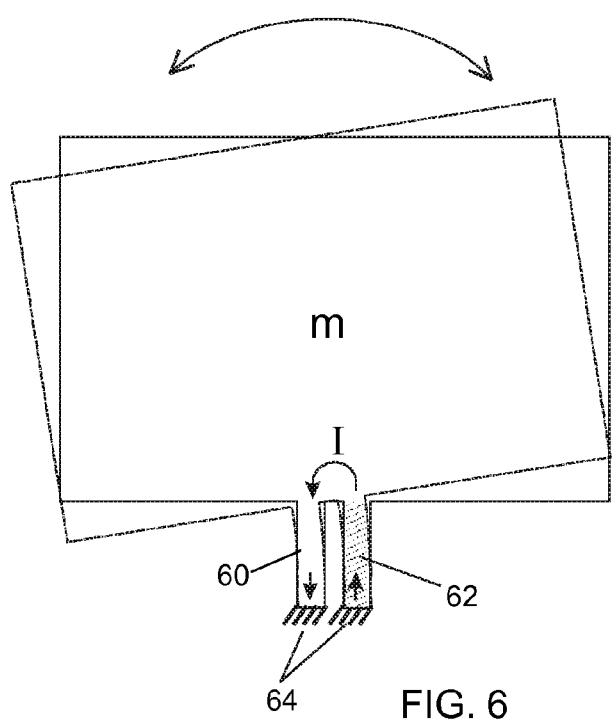
FIG. 6 shows a first example of oscillator of the invention.

FIG. 6 shows a first embodiment comprising the resonator mass m, and two beams 60, 62 connecting the mass to the fixed substrate via two anchor points 64. The whole structure, except for the two anchors, is free standing. In FIG. 6, only the top view (2D) of the device is shown. It should be understood that the structure in reality extends to the third dimension and the plane of the 2D layout is in the plane of the substrate. The structure is made of silicon. For example the structure can be made on a Silicon-On-Insulator (SOI) substrate, using the standard process for MEMS resonators. During fabrication of the structure, one beam 62 is lowly doped in such a way that the piezoresistive gauge factor is maximized. The other beam 60 and the rest of the mass m (or at least the region at the connection between the two upper ends of the beams) are highly doped to make a short connection.

When a DC current, I, flows from one anchor to the other anchor, the electrical path can be represented by two resistors connected in series: the resistor 62 has relatively high resistance and large piezoresistive effect (due to low doping) and the resistor 60 has very low resistance (due to high doping), which can be considered a short. At the highly doped beam 60, the piezoresistive effect is very small and can be ignored.

In this structure, both two beams contribute to the spring stiffness and only the right beam (having the piezoresistive effect) serves as the S-A element.

For this structure, the swinging mode is the vibration mode of interest (the mass wobbles sideways in the plane of the drawing). The dimensions of the beams and mass are chosen such that the oscillation condition according to the above analysis is satisfied. When the mass vibrates in the swinging mode, the two beams are alternatively compressed and stretched. According to the above principle, this vibration mode is amplified and finally leads to a steady oscillation state.

Figure 7:
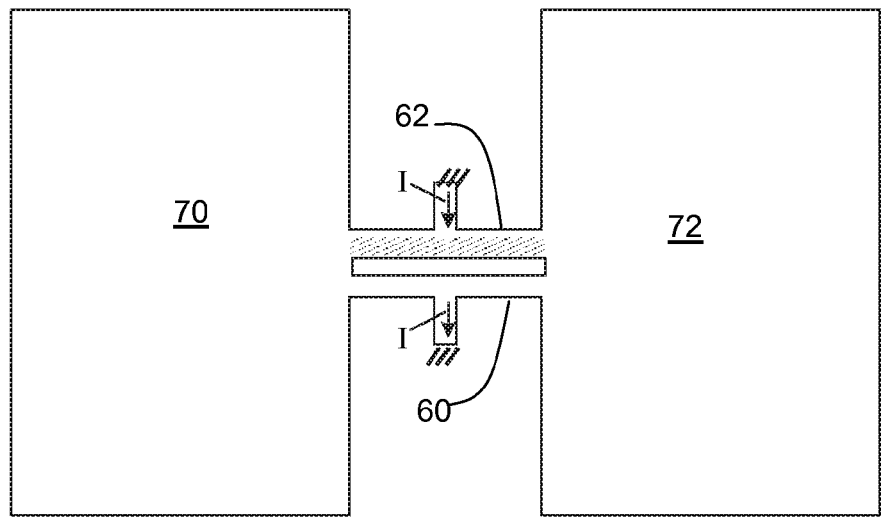
FIG. 7 shows two oscillators of the type shown in FIG. 6 couples together.

To minimize the anchor loss, thus maximize the Q-factor, two identical oscillators can be positioned back-to-back in a symmetrical configuration, as shown in FIG. 7. This shows two resonator masses 70,72 coupled together by the two arms, with a mid point of each arm being coupled to the substrate and thus defining the anchor point.

This method of connected resonator masses back to back can be applied to all examples described below, but for simplicity further examples show the simplest possible configuration.

Figure 8:
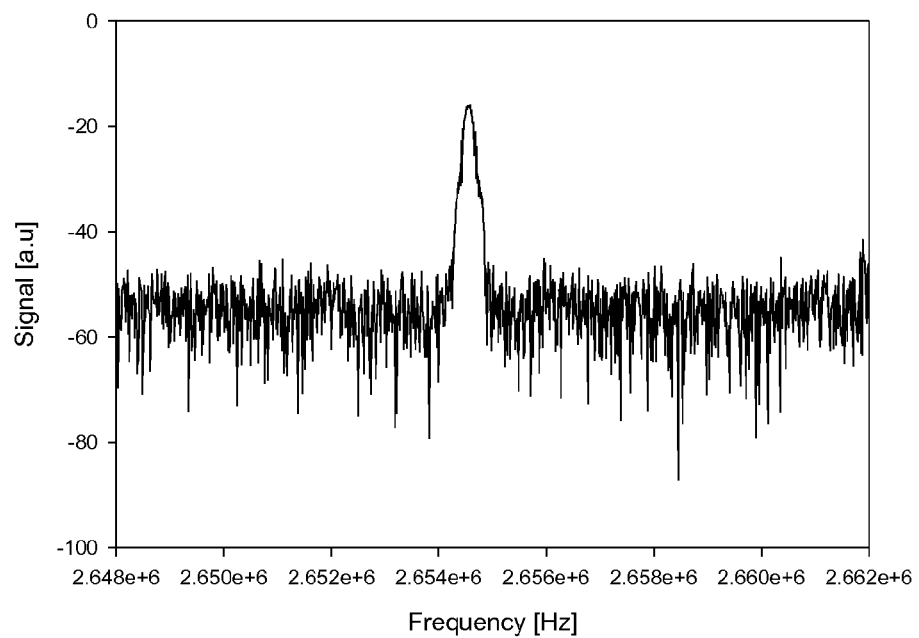
FIG. 8 shows experimental results for the oscillator of FIG. 7.

The device of FIG. 7 has been tested in a real MEMS structure. FIG. 8 shows an experimental spectrum of the device of FIG. 7. The structure used in the analysis was a silicon structure fabricated using the standard MEMS resonator process. During the measurement, a DC current of 3 mA is supplied to the device. The device shows a resonant peak at 2.65 MHz which is corresponding to the in-plane swinging mode of the masses.

Figure 9:
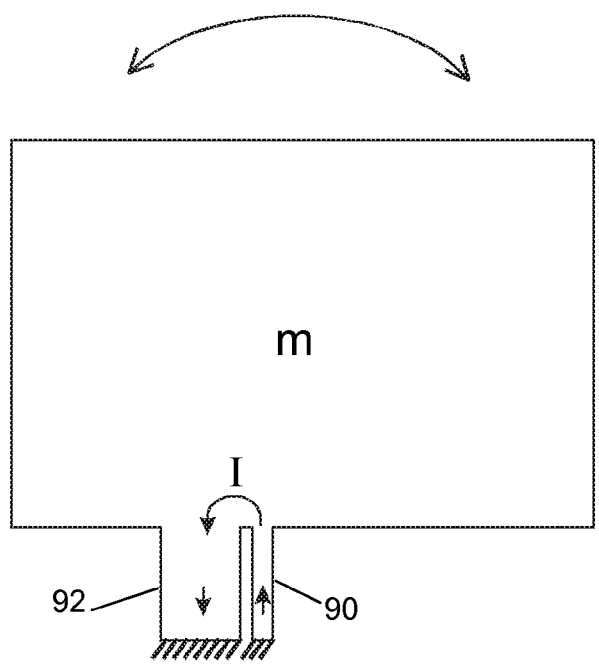
FIG. 9 shows a second example of oscillator of the invention.

A second embodiment is shown in FIG. 9, similar to the first embodiment. The device again consists of a mass and two beams 90,92. However the doping level is the same for the two beams and the mass m (or at least the region close to the connection of the two beams). One beam 92 is made significantly larger than the other one. The wider beam serves as the short connection and the narrower beam 90 serves as the S-A element. Because the wider beam has very small resistance compared to the narrower one, the piezoresistive effect of this beam can be ignored. The position of the mass can be non-symmetric with respect to the beams.

Figure 10A:
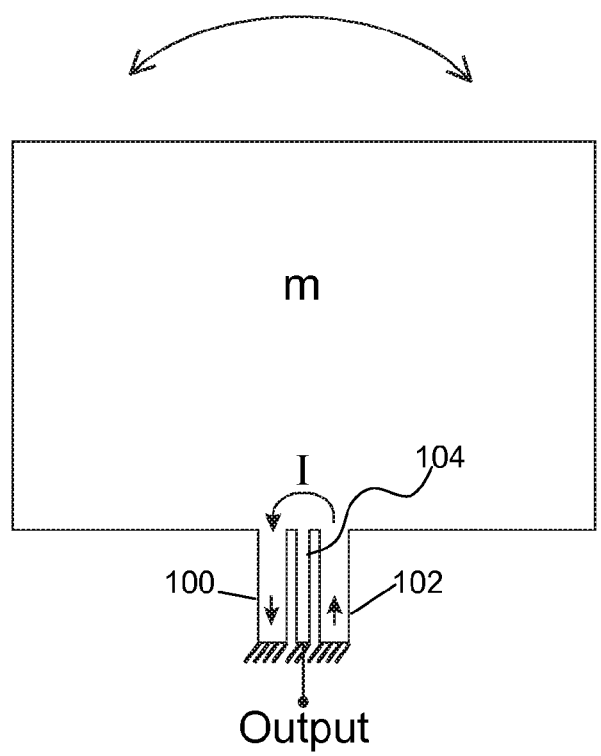
FIGS. 10a to 10c show third examples of oscillator of the invention.

A third embodiment of FIG. 10a is a further extension of the previous embodiments. Instead of having a single S-A element, two S-A elements 100, 102 are arranged on both sides of a middle beam 104. The whole structure can be doped at the same level, such as to produce a negative gauge factor. A DC current flows from one S-A element to the other (either constant voltage or constant current). The middle beam should not draw any current and is only used to sense the voltage change at the point in between the S-A elements. Thus, the middle beam functions as a voltage output tap.

Electrically, the two S-A elements are connected in series. During vibration (in the swinging mode) the two S-A elements are alternatively compressed and stretched and therefore according to the principle they alternatively push and pull back to the mass, such as to maintain the oscillation. Because the resistance of the S-A elements are changing in anti-phase, their total resistance is substantially constant, leading to a constant current in the elements, regardless of whether a constant voltage or a constant current is applied from outside. The readout circuit can be considered a half Wheatstone bridge in which the voltage at the middle beam is changing with the vibration and can be used as the output signal.

Figure 10B:
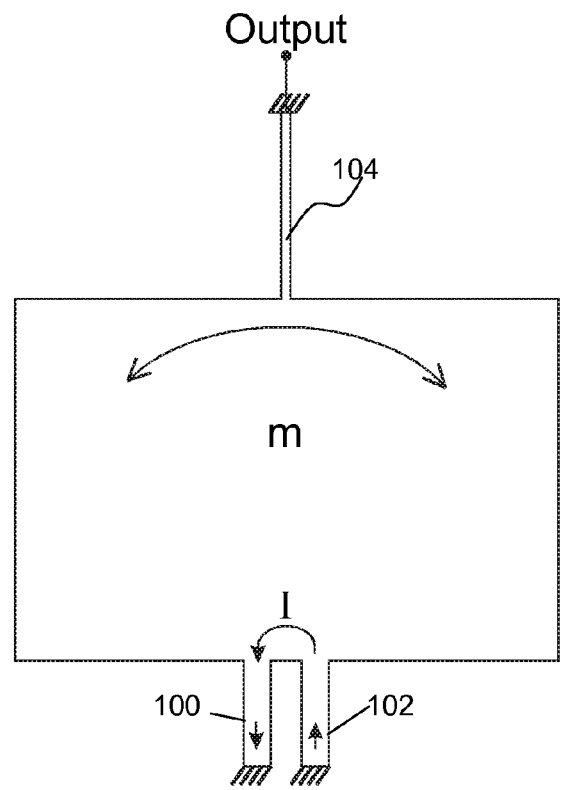

FIG. 10b shows a further extension of the third embodiment. The middle beam 104 is now positioned at the top side of the mass, in the central position. This arrangement is more preferred in the case when two identical structures are placed back-to-back in the symmetrical configuration. In this case it is difficult to connect this beam to outside if the beam is positioned in between the two S-A elements 100 and 102. The middle beam 104 is preferred to be a thin and long beam in order to minimize the energy loss through the anchor connecting this beam to the substrate, thus maximizing the Q factor.

Figure 10C:
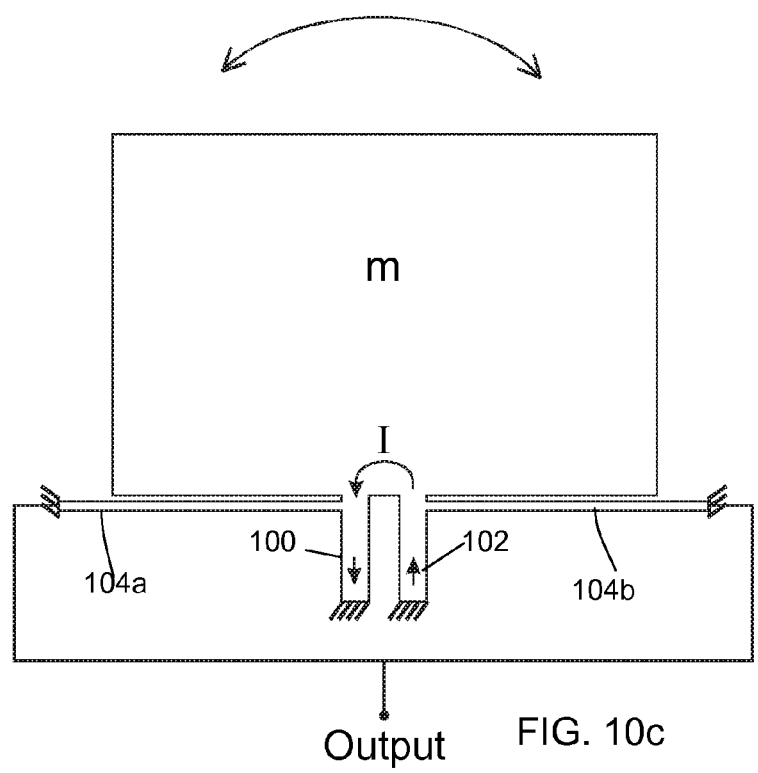

FIG. 10c shows yet another extension of the third embodiment. The middle beam 104 as in the third embodiment is now replaced by two small beams 104a,104b which are symmetrically attached to the ends of the S-A elements close to the mass. These beams are also anchored to the substrate and they are electrically connected to the output port of the device. The beams are also thin and long in order to minimize the energy loss, thus maximize the Q factor. In addition, because the attachment points of the beams at the S-A elements are close to the rotation point of the structure, the energy loss through those beams are further reduced.

Figure 11:
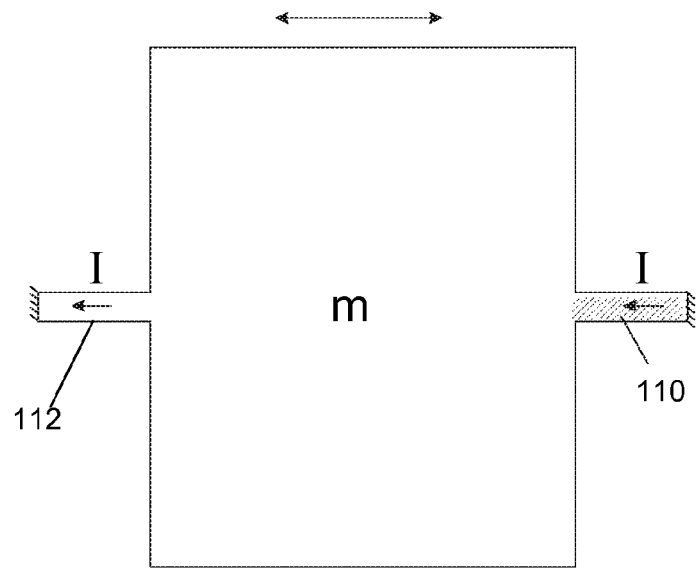
FIG. 11 shows a fourth example of oscillator of the invention.

A fourth embodiment of FIG. 11 has the resonator mass m and two beams which are attached to the mass at two opposite sides. In the vibration mode of interest the mass translates sideways, that alternatively compresses and stretches the beams in their longitudinal direction. One of the beams 110 is lowly doped and serves as the S-A element and the other beam 112 and the mass is highly doped to make a short connection between the S-A element and the other anchor.

In order to actuate and to sense the oscillation, a DC current is allowed to flow from one anchor to the other. The spring stiffness in this case is the sum of the stiffnesses of both beams in the longitudinal direction. The readout method is the same as for the example of FIG. 6, based on voltage detection.

Figure 12:
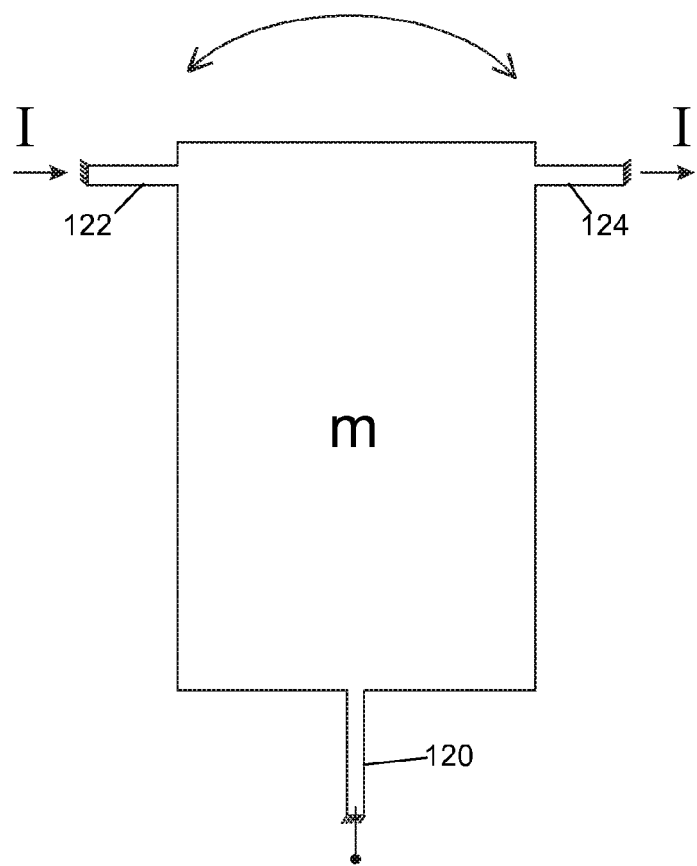
FIG. 12 shows a fifth example of oscillator of the invention.

The embodiment of FIG. 12 has the resonator mass m with three beams connected at three different sides of the mass. The vibration mode of interest is the swinging mode with the rotation point at somewhere near the middle beam 120. The stiffness associated with this vibration mode is contributed by all three beams. The whole structure is doped with the same level. The beams 122,124 on the left and right sides of the mass act as the S-A elements and the middle beam is used to pick up the output signal. A constant current I is sent from one S-A element to the other. When the mass vibrates, the two S-A elements are alternatively compressed and stretched. That means the mass is actuated using a push-pull approach. At the middle beam, a voltage change is present which can be used as the output signal.

Figure 13:
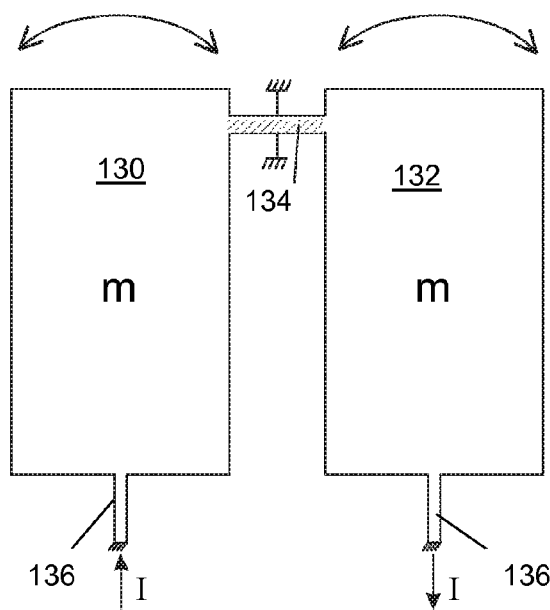
FIG. 13 shows a sixth example of oscillator of the invention.

The device in the embodiment of FIG. 13 has two mass-spring structures 130,132 connected to each other by an S-A element 134. Each structure has another beam 136 at the lower side (of the Figure) that connects the mass to the substrate. In the mode of interest, the two masses swing in anti-phase and the middle point of the S-A element is stationary. To ensure that the right mode is excited, the middle point of the S-A can be anchored as shown, but should stay electrically isolated. The S-A beam is lowly doped (to have the piezoresistive effect) and the rest is highly doped (to make a short circuit).

During operation, a DC current is sent from one beam, through the S-A element and the mass bodies, to the other beam. The S-A element contracts and extends that drives the two masses into the anti-phase swinging mode. The output signal can be obtained from the voltage change (when a constant current is used) or the current change (when a constant voltage is used).

Figure 14:
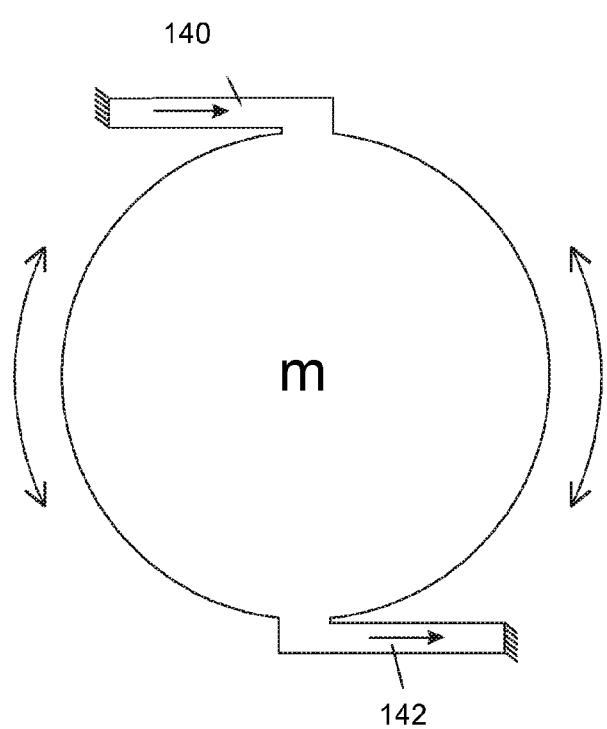
FIG. 14 shows a seventh example of oscillator of the invention.

The embodiment of FIG. 14 has a resonator mass m which has rotational symmetry. At least first and second arms connect the resonator mass to the substrate, at different angular positions around the resonator mass.

In FIG. 14, the resonator mass is round in shape, but it may be an ellipse, square, or another regular polygon. The at least two S-A elements 140, 142 are attached to the rim of the mass in tangential directions. When the two elements contract and extend in phase, they cause the mass to rotate back and forth around the centre of symmetry. This is the vibration mode of interest. A DC current is sent from one S-A element to the other. The whole structure is doped with the same concentration to enable the piezoresistive effect. Due to the large area of the mass, it serves as electrical short. Alternatively the S-A elements are lowly doped to have the piezoresistive effect and the mass can be doped with a higher level. Readout can be done again based on voltage or current detection.

Figure 15:
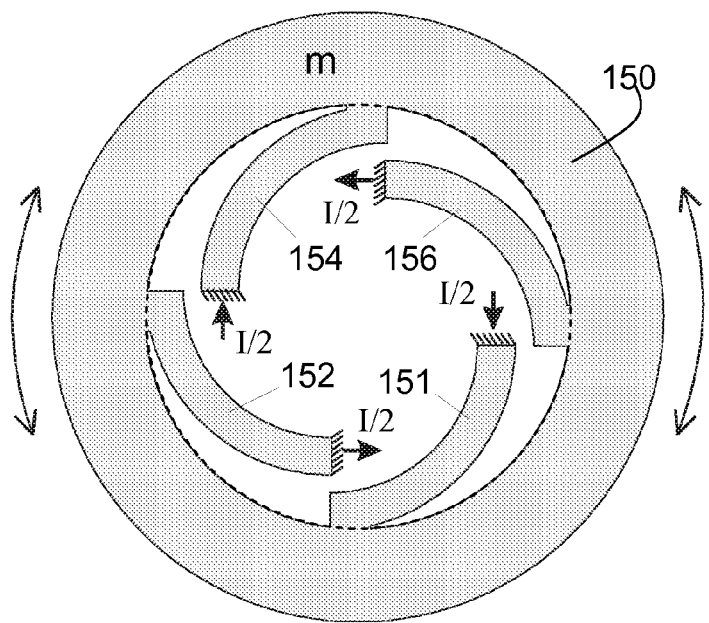
FIG. 15 shows a eighth example of oscillator of the invention.

In the embodiment of FIG. 15, the resonator mass again has rotational symmetry. However, instead of a round shape, the mass in this embodiment has an annulus (ring) shape 150. There are at least two S-A elements 151,152,154,156 (four in the example shown) having a curved shape attached to the inner rim of the ring in the tangential directions. A DC current is split into two equal flows: they enter the structure at two S-A elements and leave at the other two. During operation, all the S-A elements contract and extend in phase, leading to a rotational vibration mode of the ring. Reading out can be done in the same way as for the embodiment of FIG. 14.

Figure 16:
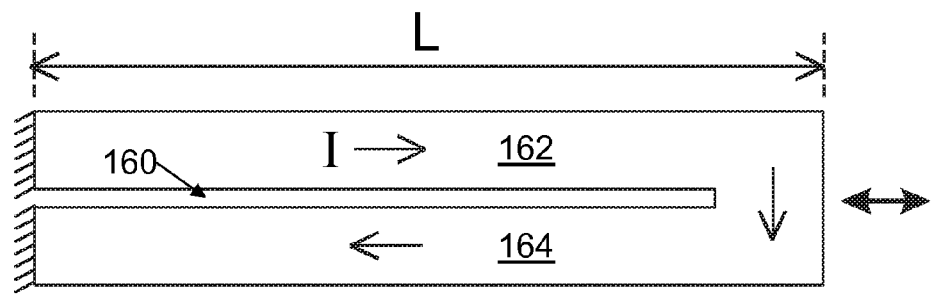
FIG. 16 shows a ninth example of oscillator of the invention.

The design shown in FIG. 16 resembles a clamped-free resonator structure but it has a slit 160 along the middle of the beam, dividing the beam into two legs 162,164. At the tip (free end) of the beam the two legs are still connected. A DC current can flow from one leg of the beam to the other leg. The vibration mode in this case is the longitudinal bulk acoustic wave (BAW) mode in which the mass and the spring are merged inside the same structure. The S-A elements are the legs of the structure, which can resonate itself in the BAW mode.

The BAW mode resonance frequency of the structure is given by:

$$\omega_0 = \frac{\pi}{2L}\sqrt{\frac{E}{\rho}} \quad (21)$$

in which L is the length of the structure. Combining Eq. (21) with Eq. (19) gives a characteristic resonance frequency $\omega_{th}$ for Si, $$\omega_{th} = \frac{\pi^2}{16}\frac{c_s E}{\kappa} \quad (22)$$

Assuming E=130 GPa for (100) direction, $\kappa$=100 Wm$^{-1}$K$^{-1}$ (at RT), $c_s$=850 Jkg$^{-1}$K$^{-1}$ (at RT), $\rho$=2330 kg/m$^3$, results in $f_{th}=\omega_{th}/2\pi$=89 GHz and characteristic length L=21 nm.

Figure 17:
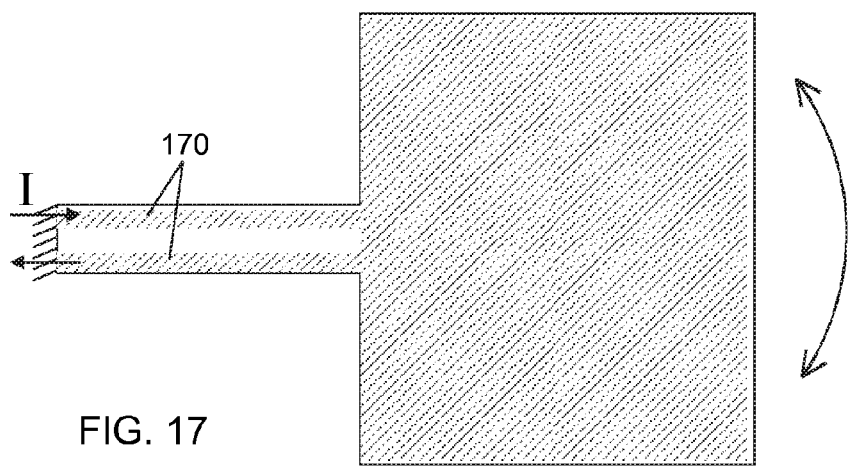
FIG. 17 shows a tenth example of oscillator of the invention.

In all the embodiments above, the S-A elements mainly work in the longitudinal mode, i.e. they are longitudinally compressed and extended. In the embodiment of FIG. 17, bending S-A elements can also work if the doping scheme of the elements can be specially designed.

A beam can be considered to have a deformation which has a significant bending component with a radius of curvature R. In this case the center line of the beam will have zero strain. The outer radius will have tensile strain and the inner radius will have compressive strain. The edges of the beam are analogous to the separate beams in FIG. 6. To use the edges to form the S-A elements, the edges 170 of the beam are doped which serve as the S-A elements and middle part of the beam is be un-doped to electrically separate the edges.

The device works in the push-pull mode, meaning that the edges of the beams are alternatively compressed and extended. This makes the beam alternatively bending in both sides.

The invention provides a simplified oscillator structure. A complete oscillator can be realized within one single MEMS structure, without having to use any external circuit. There is no need for transduction gaps and high DC voltage. Only a small DC current is needed to actuate the device and to provide an output signal. The device is compatible with silicon process technology. Thus, the device manufacture can be very simple, since the device can be a structure made of only one uniform material with piezoresistive properties (e.g. silicon). The resonance frequency can be controlled by design, compatible with silicon process technology, and high linearity of the elements can be achieved (no transistors needed), with high Q-factor.

By integrating the feedback control element as part of the structure of the resonator mass, the oscillator does not need external electrodes to control the resonator vibration. Thus, fixed actuation electrodes are not required. These typically need to be closely spaced to the resonator mass (for example with a spacing less than 1 μm). The resonator mass in the device of the invention can be surrounded by a large lateral gap, for example greater than 5 μm. This can help to relax processing requirements. The arrangement of the invention can avoid the need for closely spaced readout electrodes as well, as the piezoresistive effect can also be employed to enable the readout of the oscillating signal, as explained above.

The device, in the same way as the other conventional MEMS-based oscillators, can replace the traditional quartz oscillators, which are used for time referencing applications such as in GSM devices, Bluetooth, and many other RF circuits. The device can also be used in any type of resonant sensors, such as strain sensors, biosensors, etc. that use mechanical resonance as the detection method.

In principle, all materials that posses the piezoresistive effect can be used to form the feedback element. The piezoresistive effect exists in many metals, metal alloys and semiconductors. The effect in semiconductors is much larger than that in metals and metal alloys (although metals are used in strain gauges). Examples of metals and metal alloys are: platinum, nickel, constantan (copper-nickel alloy), nichrome V (nickel-chrome alloy), platinum alloys (usually tungsten), isoelastic (nickel-iron alloy), or karma-type alloy wires (nickel-chrome alloy). Although the device has been described as formed from silicon, other semiconductors can be used. Examples of suitable semiconductors are Si, Ge, SiGe, SiC, III-V type of semiconductors such as: GaAs, InSb, InAs.

In the preferred examples above, the sensing (i.e. the output of the oscillating signal) is implemented using the piezoresistive element, for example by measuring a voltage for a constant current implementation, or measuring current for a constant voltage implementation. However, other sensing methods can also be used, for example capacitive sensing of a gap adjacent the resonator mass, or any other known sensing approach. Even if the sensing is not fully integrated as in the preferred examples, the invention still provides significant simplification in that the mechanical feedback resulting in the mechanical oscillation can be fully integrated into the structure of the oscillator device.

Various modifications will be apparent to those skilled in the art.

The invention claimed is:

1. An oscillator device, comprising:
   a resonator mass connected by a spring arrangement to a substrate;
   a feedback element for controlling oscillation of the resonator mass, which comprises a piezoresistive element connected to the resonator mass and which is arranged such that strain in the piezoresistive element varies in response to movement of the resonator mass, and a change in strain in the piezoresistive element causes a change in electrical resistance, wherein the feedback element comprises at least two arms separately configured and arranged for connection to the resonator mass;
   a driver for driving a current through the feedback element; and
   an actuator for controlling the oscillation which actuator includes terminals for driving the current through the feedback element.

2. An oscillator device as claimed in claim 1, wherein the driver comprises one of a current source and a voltage source for supplying, respectively, one of a current and a voltage to the piezoresistive element.

3. An oscillator device as claimed in claim 1, further comprising two said resonator masses coupled together by the feedback element which is in the form of a first arm of the at least two arms, wherein each resonator mass has a respective second arm of the at least two arms, one of which comprises a current input arm and the other of which comprises a current output arm.

4. An oscillator device as claimed in claim 1, wherein the resonator mass has rotational symmetry, with at least first and second feedback elements in the form of the arms connecting the resonator mass to the substrate, at different angular positions around the resonator mass.

5. An oscillator device as claimed in claim 1, wherein at least one output arm extends from the resonator mass, for providing an output voltage.

6. An oscillator device as claimed in claim 1, wherein opposite edges of one of the at least two arms define a pair of piezoresistive elements.

7. An oscillator device as claimed in claim 1, wherein the resonator mass and the feedback element are at least a part of a single body.

8. An oscillator device as claimed in claim 1, wherein the resonator mass and the spring arrangement are at least a part of a single body.

9. An oscillator device as claimed in claim 1, wherein the resonator mass is a silicon body.

10. An oscillator device, comprising:
    a resonator mass connected by a spring arrangement to a substrate;
    a feedback element for controlling oscillation of the resonator mass, which comprises a piezoresistive element connected to the resonator mass and which is arranged such that strain in the piezoresistive element varies in response to movement of the resonator mass, and a change in strain in the piezoresistive element causes a change in electrical resistance;
    a driver for driving a current through the feedback element; and
    an actuator for controlling the oscillation which actuator includes terminals for driving the current through the feedback element, wherein the resonator mass is connected to the substrate by at least two arms which together form the spring arrangement, wherein a first arm comprises the piezoresistive element and a second arm comprises a current return path for the piezoresistive element, and the second arm forms part of the feedback element from which any piezoresistive effect is negligible relative to a piezoelectric effect due to the first arm.

11. An oscillator device as claimed in claim 10, further comprising two said resonator masses coupled together by the at least two arms, with a mid point of each arm being coupled to the substrate.

12. An oscillator device as claimed in claim 10, wherein the first, piezoresistive element arm is smaller in cross section than the second arm.

13. An oscillator device comprising:
    a resonator mass;
    a spring arrangement that connects the resonator mass to a substrate, the spring arrangement having a first arm including a piezoresistive element connected to the resonator mass and a second arm providing a current return path for the piezoresistive element, the first arm being doped with a first doping level, and the second arm being doped with a second, higher doping level;
    a feedback element configured and arranged to control oscillation of the resonator mass, the feedback element including the piezoresistive element and configured and arranged to exhibit a change in electrical resistance in response to strain in the piezoresistive element that varies in response to movement of the resonator mass;
    a driver configured and arranged to drive a current through the feedback element; and
    an actuator including terminals for driving the current through the feedback element to control the oscillation.

14. A method of generating an oscillating signal, comprising:
    driving a current through a piezoresistive element using terminals which function as an actuator controlling oscillation;
    controlling oscillation of a resonator mass using the piezoresistive element using a feedback arrangement in which at least two arms are separately configured and arranged for connection to the resonator mass, which is arranged such that strain in the piezoresistive element varies in response to movement of the resonator mass, and a change in strain in the piezoresistive element causes a change in electrical resistance and thereby controlling oscillation of the resonator mass; and
    sensing a movement of the resonator mass to derive the oscillating signal.

15. An apparatus comprising:
    a resonator connected to a substrate by a spring arrangement having first and second arms, the first arm having a piezoresistive feedback circuit, the second arm being larger in cross section than the first arm, the piezoresistive feedback circuit being configured and arranged to regulate oscillation of the resonator by changing in electrical resistance in response to strain variations caused by movement of the resonator; and
    an actuator circuit having terminals connected to the first and second arms and configured and arranged to oscillate the resonator by driving a current through the feedback circuit, the current being returned to the actuator circuit via second arm.

* * * * *